(12) United States Patent
Shim et al.

(10) Patent No.: US 10,355,013 B2
(45) Date of Patent: Jul. 16, 2019

(54) SEMICONDUCTOR DEVICE AND METHOD OF MANUFACTURING THE SAME

(71) Applicant: SK hynix Inc., Gyeonggi-do (KR)

(72) Inventors: Sung Bo Shim, Gyeonggi-do (KR); Jung Dal Choi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/850,592

(22) Filed: Dec. 21, 2017

(65) Prior Publication Data
US 2018/0323207 A1 Nov. 8, 2018

(30) Foreign Application Priority Data
May 4, 2017 (KR) .................. 10-2017-0056984

(51) Int. Cl.
| | |
|---|---|
| *H01L 27/11582* | (2017.01) |
| *H01L 27/06* | (2006.01) |
| *H01L 27/12* | (2006.01) |
| *G11C 16/16* | (2006.01) |
| *H01L 21/822* | (2006.01) |
| *G11C 16/34* | (2006.01) |
| *H01L 23/00* | (2006.01) |
| *G11C 16/30* | (2006.01) |
| *H01L 27/11565* | (2017.01) |
| *H01L 27/1157* | (2017.01) |
| *H01L 27/11573* | (2017.01) |
| *H01L 27/11575* | (2017.01) |
| *G11C 5/02* | (2006.01) |

(52) U.S. Cl.
CPC ........ *H01L 27/11582* (2013.01); *G11C 16/16* (2013.01); *G11C 16/30* (2013.01); *G11C 16/3445* (2013.01); *H01L 21/8221* (2013.01); *H01L 24/09* (2013.01); *H01L 27/0688* (2013.01); *H01L 27/1157* (2013.01); *H01L 27/11565* (2013.01); *H01L 27/11573* (2013.01); *H01L 27/11575* (2013.01); *H01L 27/1203* (2013.01); *G11C 5/02* (2013.01)

(58) Field of Classification Search
None
See application file for complete search history.

(56) References Cited

U.S. PATENT DOCUMENTS

| | | | | |
|---|---|---|---|---|
| 8,575,590 B2 * | 11/2013 | Muraoka | ............ | G11C 13/0004 257/2 |
| 2016/0307632 A1 * | 10/2016 | Lee | .................. | G11C 16/14 |

FOREIGN PATENT DOCUMENTS

KR 1020160000047 1/2016

* cited by examiner

*Primary Examiner* — Long Pham
(74) *Attorney, Agent, or Firm* — IP & T Group LLP

(57) ABSTRACT

Provided herein may be a semiconductor device. The semiconductor device may include a first substrate, a second substrate disposed on the first substrate, a stack which is disposed on the second substrate and includes stacked memory cells, and a discharge contact structure electrically coupling the second substrate with the first substrate such that charges in the second substrate are discharged to the first substrate.

19 Claims, 12 Drawing Sheets

A-A'

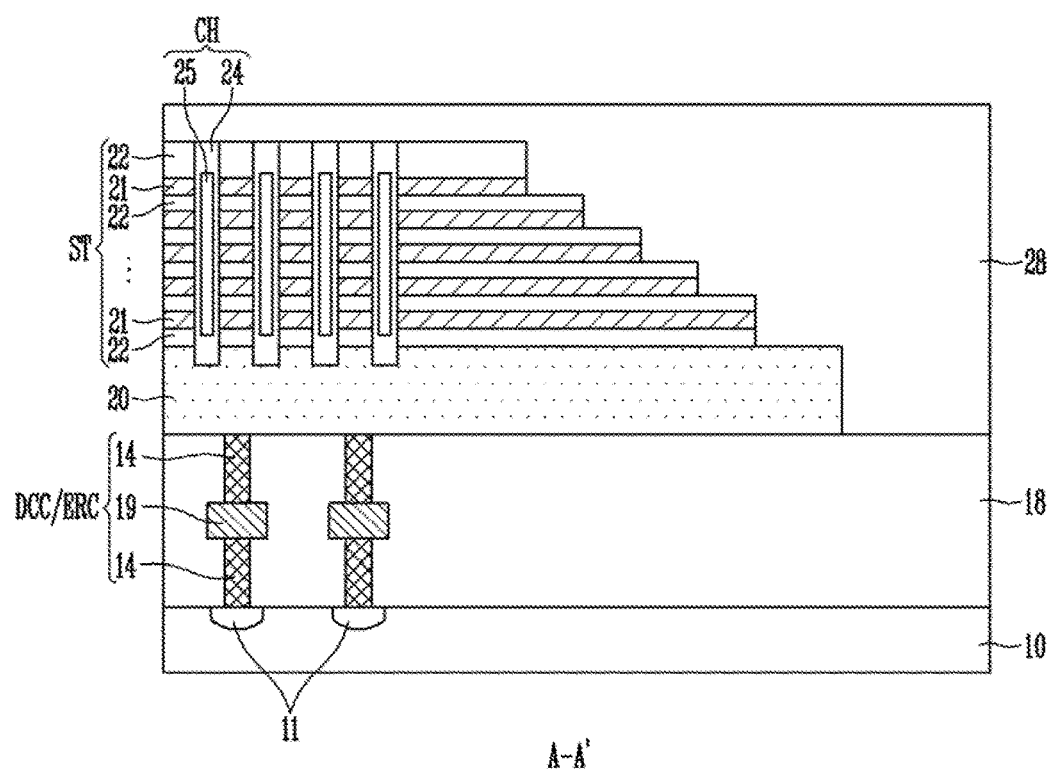

SEMICONDUCTOR DEVICE AND METHOD OF MANUFACTURING THE SAME

CROSS-REFERENCE TO RELATED APPLICATION

The present application claims priority under 35 U.S.C. § 119(a) to Korean patent application number 10-2017-0056984 filed on May 4, 2017 in the Korean Intellectual Property Office, the entire disclosure of which is incorporated herein by reference.

BACKGROUND

1. Field of Invention

Various embodiments of the present disclosure generally relate to an electronic device, and more particularly, to a semiconductor device and a method of manufacturing the same.

2. Description of Related Art

Non-volatile memory devices retain stored data regardless of power on/off conditions. Recently, as a two-dimensional non-volatile memory device including memory cells formed on a substrate: in a single layer has reached a limit in enhancing its degree of integration, a three-dimensional (3D) non-volatile memory device including memory cells stacked in a vertical direction on a substrate has been proposed.

A three-dimensional non-volatile memory device may include interlayer insulating layers and gate electrodes that are stacked alternately with each other, and channel layers passing therethrough, with memory cells stacked along the channel layers. To improve the operational reliability of such a non-volatile memory device having a three-dimensional structure, various structures and manufacturing methods have been developed.

SUMMARY

Various embodiments of the present disclosure are directed to a semiconductor device which is configured to facilitate the manufacturing process thereof and has stable structure and improved characteristics, and a method of manufacturing the same.

An embodiment of the present disclosure may provide for a semiconductor device including: a first substrate; a second substrate disposed over the first substrate; a stack with stacked memory cells disposed on the second substrate; and a discharge contact structure electrically coupling the second substrate with the first substrate, wherein charges in the second substrate are discharged to the first substrate.

An embodiment of the present disclosure may provide for a method of manufacturing a semiconductor device including: forming an interlayer insulating layer on a first substrate, the interlayer insulating layer including a discharge contact structure electrically coupled with the first substrate; forming a second substrate on the interlayer insulating layer, the second substrate being electrically coupled with the first substrate through the discharge contact structure; forming a stack on the second substrate; and forming, channel structures passing through the stack.

BRIEF DESCRIPTION OF THE DRAWINGS

FIGS. 3A to 3C are diagrams illustrating a structure of a semiconductor device according to an embodiment of the present disclosure.

DETAILED DESCRIPTION

Figure 1A:
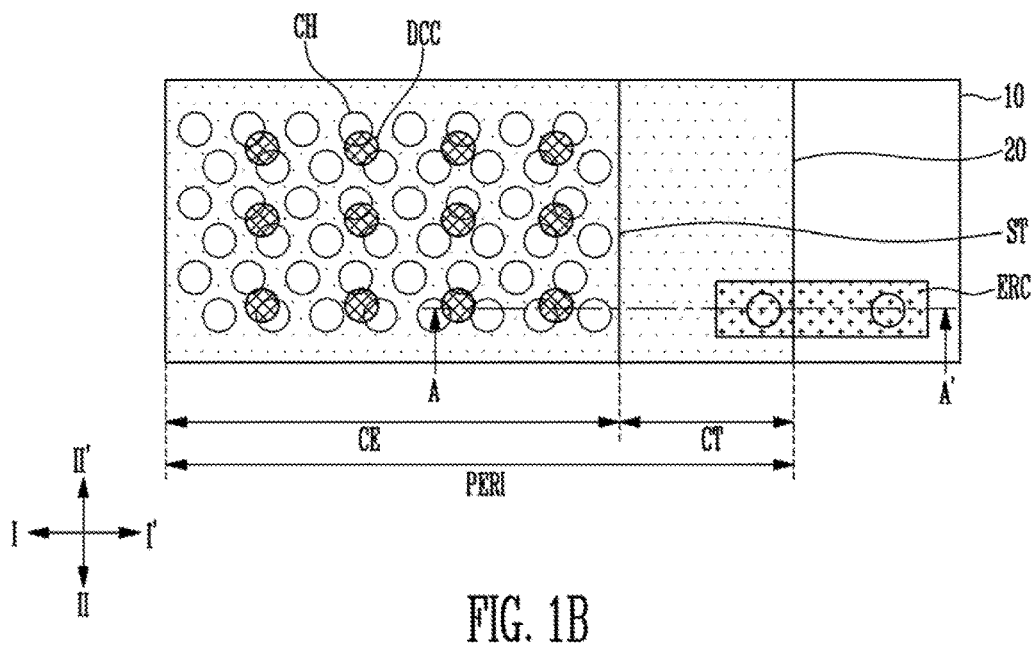
FIGS. 1A to 1C are diagrams illustrating a structure of a semiconductor device according to an embodiment of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present.

Hereinafter, embodiments will be described with reference to the accompanying drawings. Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as 'first' and 'second' may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, 'and/or' may include any one of or a combination of the components mentioned.

Furthermore, a singular form may include a plural from as long as it is not specifically mentioned in a sentence. Furthermore, "include/comprise" or "including/comprising" used in the specification represents that one or ore components, steps operations, and elements exist or are added.

Furthermore, unless defined otherwise all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

A described or illustrated example of a multi-layer structure may not reflect all layers present in that particular multi-layer structure (e.g., one or more additional layers may be present between two illustrated layers). As a specific example, when a first layer in a described or illustrated multi-layer structure is referred to as being or "over" a second layer, the first layer may be directly formed on the second layer but may also represent a structure where one or more other intermediate layers may exist between the first layer and the second layer.

Figure 1B:
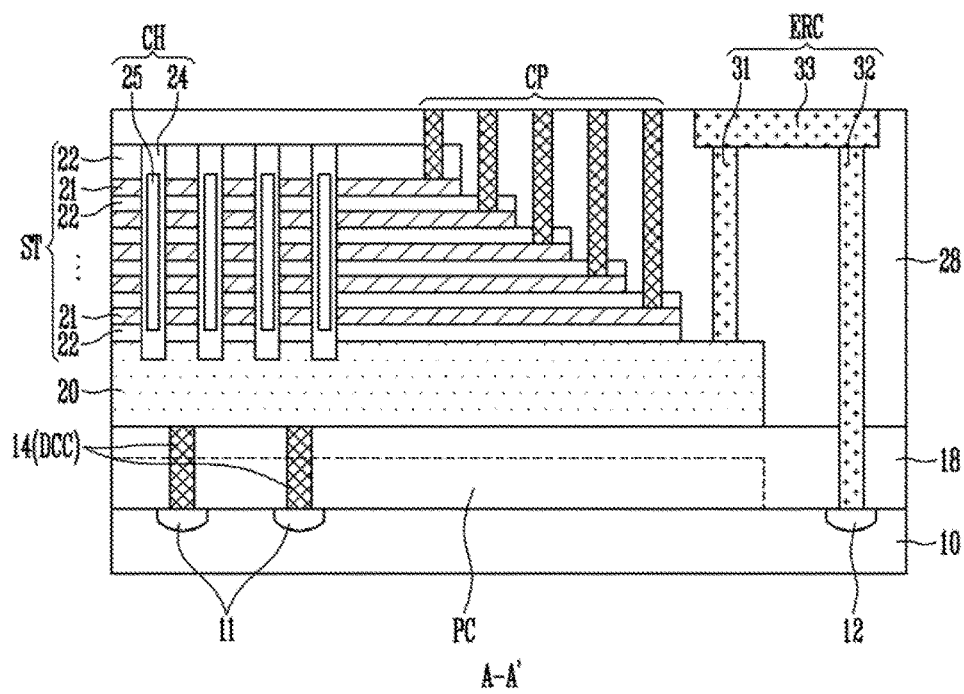
Figure 1C:
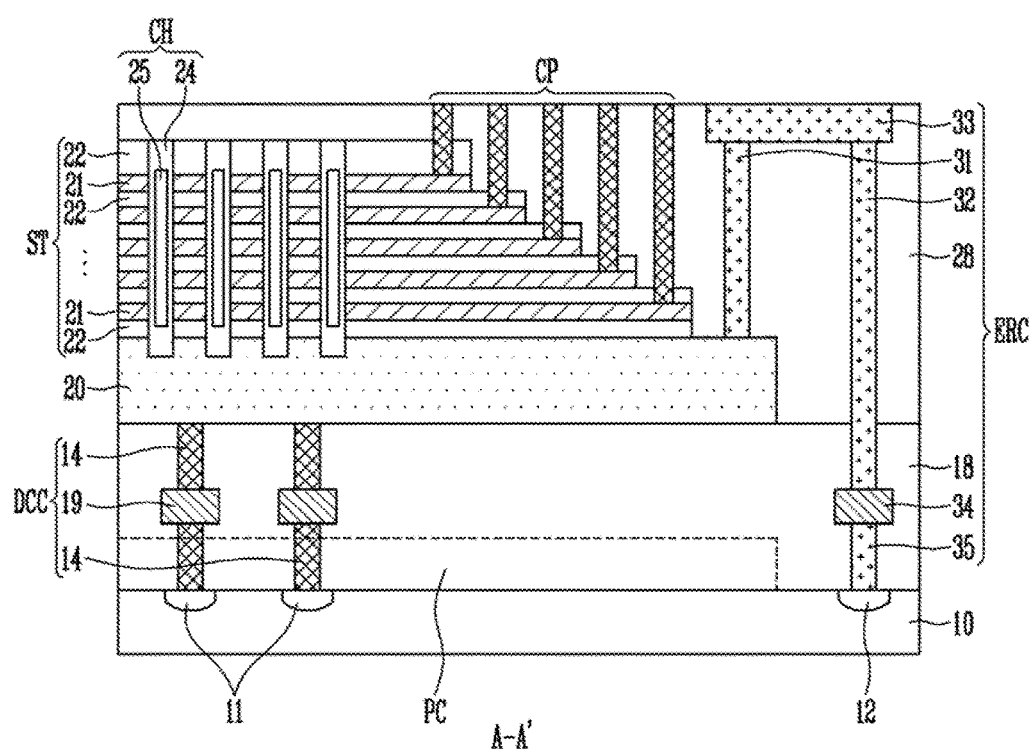

FIGS. 1A to 1C are diagrams Illustrating a structure of a semiconductor device according to an embodiment of the present disclosure. FIG. 1A is a layout diagram. FIGS. 1B and 1C are sectional views taken along line A-A' of FIG. 1A.

Referring to FIGS. 1A and 1B, the semiconductor device according to the embodiment of the present disclosure may include a first substrate 10 a second substrate 20 disposed on the first substrate 10, a stack ST formed on the second substrate 20, and a discharge contact structure DCC, which electrically couples the first substrate 10 with the second substrate 20.

The second substrate 20 may be disposed on the first substrate 10, and be disposed in parallel to the first substrate 10 such that a rear surface of the second substrate 20 and a front surface of the first substrate 10 face each other. The first substrate 10 and the second substrate 20 may be a semiconductor substrate including semiconductor material such as silicon (Si), germanium (Ge), or the like, The second substrate 20 may include a cell region CE and a contact region CT. A cell array may be disposed in the cell region CE of the second substrate 20, and a contact structure such as contact plugs CP, and lines may be disposed in the contact region CT of the second substrate 20. The first substrate 10 may include a peripheral region PERI. A peripheral circuit PC for driving the cell array may be disposed in the peripheral region PERI of the first substrate 10. In other words, the peripheral circuit. PC may be disposed below the cell array.

The stack ST may be formed on the second substrate 20 and include conductive layers 21 and insulating layers 22 that are alternately stacked. The conductive layers 21 may be gate electrodes of a select transistor, memory cells, and the like. The insulating layers 22 may insulate the stacked conductive layers 21 from each other, and be an insulating layer such as an oxide layer.

The stack ST may include the cell region CE and the contact region CT. The cell region CE is a region in which the stacked memory cells are disposed. The contact region CT is a region in which an interconnection structure, e.g., contact plugs CT, for applying biases to the respective stacked conductive layers 21 is disposed. The contact region CT of the stack ST has a structure in which each of the conductive layers 21 is exposed through the contact region CT. For example, the contact region CT of the stack ST may be patterned in a stepped shape or have a shape in which an end of each of the conductive layers 21 is bent upward. The cell region CE of the second substrate 20 and the cell region CE of the stack ST may correspond to each other. The contact region CT of the second substrate 20 and the contact region CT of the stack ST may correspond to each other.

Channel structures CH pass through the stack ST in a stack direction, which may be a direction in which the conductive layers 21 and the insulating layers 22 are alternately stacked, or a direction vertically protruding from a surface of the second substrate 20. Each of the channel structures CH may have a shape such as a straight shape, a U shape, or a W shape. For example, when the channel structure CH is a straight type structure, vertical memory strings may be arranged on the second substrate 20. In this case, the second substrate 20 may include a well region, and also include a source region where the second substrate 20 is in contact with the channel structures CH.

Each of the channel structures CH may include a channel layer 24 and a gap fill insulating layer 25. The channel layers 24 may be channel layers of a select transistor, memory cells, etc. Each of the channel layers 24 may be a semiconductor layer including silicon (Si) germanium (Ge), or the like. The channel layers 24 may be arranged in a first direction and in a second direction intersecting the first direction I-I'. The channel layers 24 adjacent to each other in the second direction II-II' may be arranged in a staggered form such that the centers thereof are offset from each other, Each of the channel layers 24 may have a solid structure or a structure in which a central region thereof is open. The open central region of each of the channel layers 24 may be filled with the gap fill insulating layer 25. The sidewall of each of the channel layers 24 may be enclosed by a memory layer (not shown). The memory layer may include an electric charge blocking layer, a data storage layer, and a tunnel insulating layer. The data storage layer may include a floating gate, charge trap material, silicon, nitride, phase-change material, resistance-change material nanodots, or the like.

The discharge contact structure DCC is disposed between the first substrate 10 and the second substrate 20, and electrically couples the first substrate 10 with the second substrate 20. For example, the discharge contact structure DCC includes at least one contact plug 14. In this case, each of the contact plugs 14 may come into contact with the front surface of the first substrate 10 and the rear surface of the second substrate 20. The first substrate 10 may include a first junction 11 formed in the front surface of the first substrate 10 that comes into contact with the contact plugs 14. For example, the first junction 11 may be a region doped with a P-type impurity.

The discharge contact structure DCC may be disposed below the cell region CE of the stack ST. For example, the discharge contact structure DCC may be disposed below the channel structures CH. In the case where the discharge contact structure DCC includes the contact plugs 14, the contact plugs 14 may be arranged in the first direction and the second direction II-II'. Each of the contact plugs 14 and the channel structure CH may be disposed in a staggered form such that the centers thereof are offset from each other. In other words, each of the contact plugs 14 may be disposed between the adjacent channel structures CH. In addition, the arrangement of the contact plugs 14 may change depending on the layout of the peripheral circuit PC disposed on the first substrate 10. The contact plugs 14 may even be randomly arranged.

The semiconductor device may further include an erase contact structure ERC for applying an erase bias to the well region of the second substrate 20 during an erase operation.

Although the figures show a single erase contact structure ERC, the present disclosure is not limited thereto and the semiconductor device may include a plurality of erase contact structures ERC, The erase contact structure ERC has a structure in which the first substrate 10 is electrically coupled with the second substrate 20. For instance, the erase contact structure ERC includes a first contact plug 31 electrically coupled with a front surface of the second substrate 20, a second contact plug 32 electrically coupled with the front surface of the first substrate 10, and a line 33 that electrically couples the first contact plug 31 with the second contact plug 32.

The first contact plug 31 may pass through a second interlayer insulating layer 28. The second contact plug 3 may pass through a first interlayer insulating layer 18 and the second interlayer insulating layer 28. The first substrate 10 may include a second junction 12 defined m the front surface of the first substrate 10 that comes into contact with the second contact plug 32. For example, the second junction 12 may be a region doped with a P-type impurity.

FIG. 1C is a modified embodiment of the discharge contact structure DCC and the erase contact structure ERC. The other structures of the semiconductor device shown in FIG. 1C are similar with those of FIG. 1B. Referring to FIG. 1C, the discharge contact structure DCC may include the plurality of contact plugs 14 and at least one line 19. The first substrate 10 and the second substrate 20 may be coupled through the plurality of contact plugs 14 and at least one line 19. For example, a lower contact plug 14 may contact the front surface of the first substrate 10, an upper contact plug 14 may contact the rear surface of the second substrate 20 and the line 19 may couple the lower contact plug 14 and the upper contact plug 14. Although a single layer of the line 19 is located between the lower contact plug 14 and the upper contact plug 14 as shown in FIG. 1C, the lines 19 stacked in multiple layers may be located between the lower contact plug 14 and the upper contact plug 14. In addition, the stacked lines 19 may be coupled to each other by the contact plugs, The erase contact structure ERC may include a plurality of contact plugs 31, 32 and 35, and a plurality of lines 33 and 34. An upper contact plug 32 and a lower contact plug 35 may be coupled through the line 34. In addition, the line 34 may be arranged in multiple layers, and the line 34 of the erase contact structure ERC may be located at the same level as the line 19 of the discharge contact structure DCC.

According to the above-described configuration, the second substrate 20 is electrically coupled with the first substrate 10 through the discharge contact structure DCC, without floating on the first interlayer insulating layer 18,. Therefore, charges may be discharged to the first substrate 10 without being accumulated in the second substrate 20. As a result, the semiconductor device may prevent damages caused by accumulated charges. For example, the semiconductor device of the present disclosure may prevent an arcing phenomenon by which the second substrate 20 is damaged, and a distortion phenomenon in which the channel structure CH is distorted.

Figure 2A:
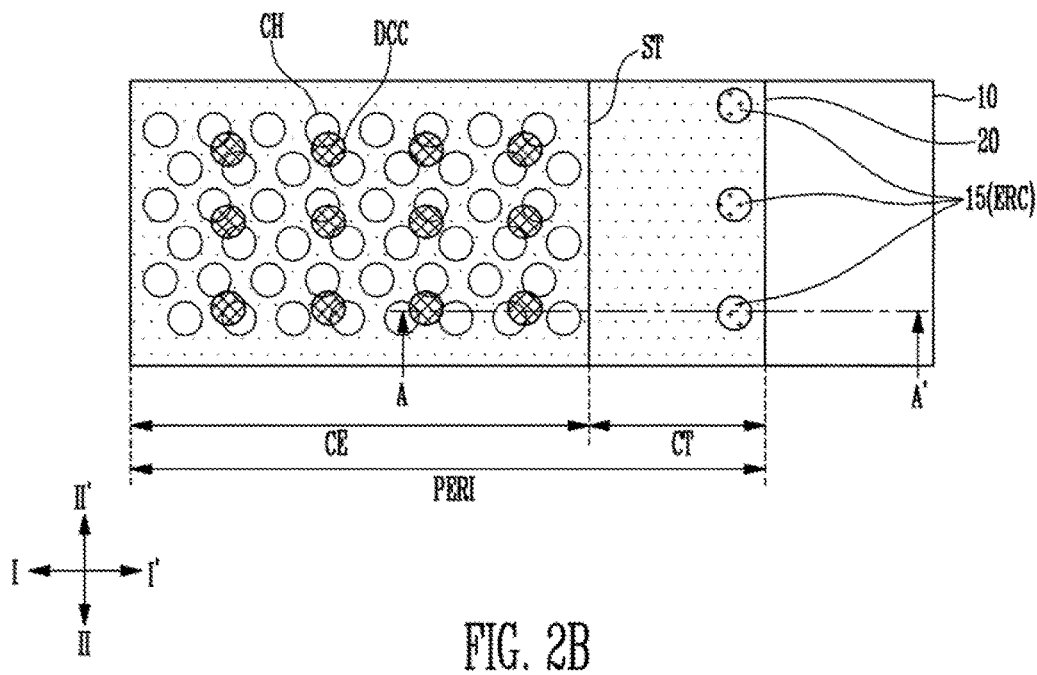
FIGS. 2A to 2C are diagrams illustrating a structure of a semiconductor device according to an embodiment of the present disclosure.
Figure 2B:
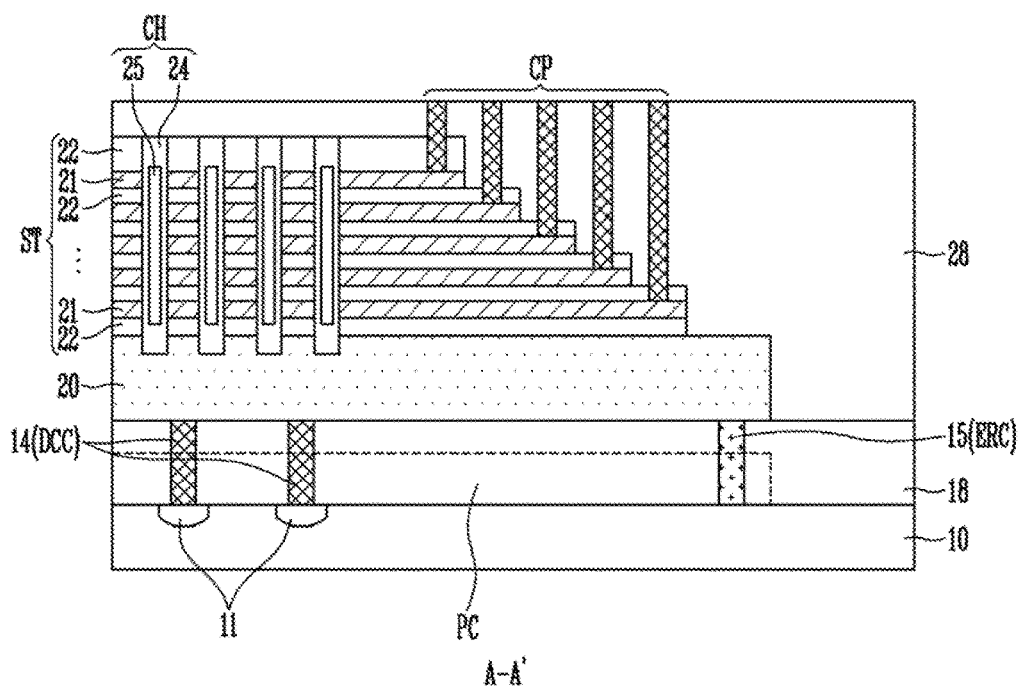
Figure 2C:
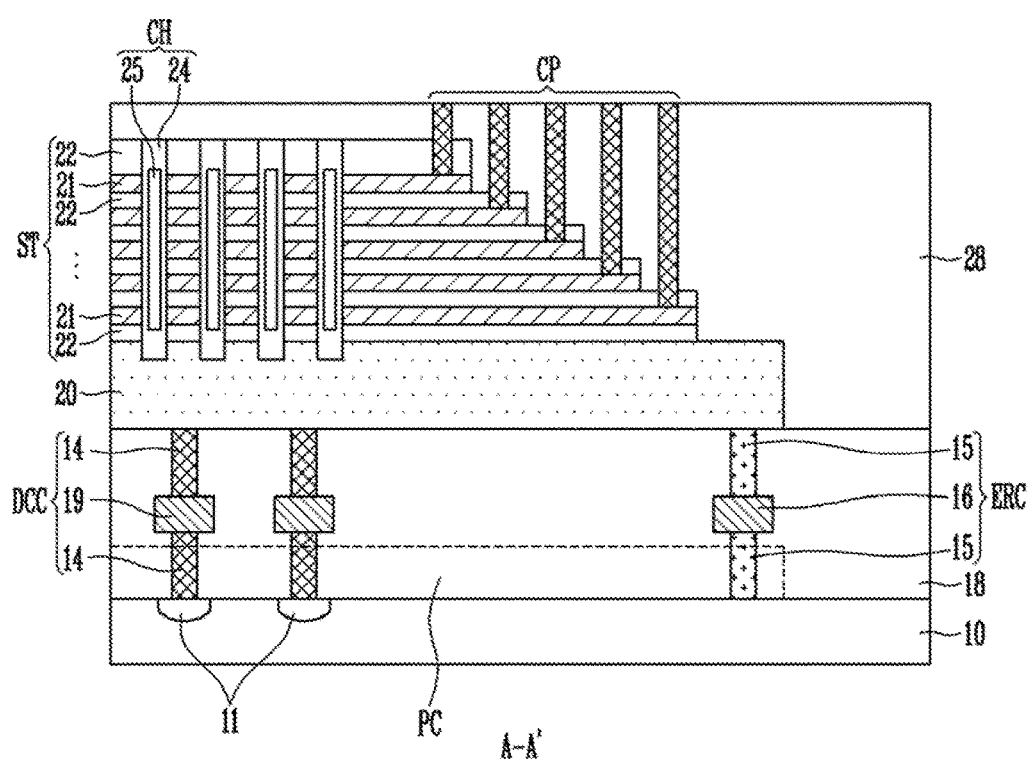

FIGS. 2A to 2C are views illustrating a structure of a semiconductor device according to an embodiment of the present disclosure. FIG. 2A is a layout diagram. FIGS. 2B and 2C are sectional views taken along line A-A' of FIG. 2A. Hereinbelow, repetitive explanation will be omitted if deemed redundant.

Referring to FIGS. 2A and 2B, the semiconductor device according to the embodiment of the present disclosure may include a discharge contact structure DCC and an erase contact structure ERC, both of which electrically couple a first substrate 10 with a second substrate 20. The discharge contact structure DCC and the erase contact structure ERC may be disposed under the second substrate 20.

The erase contact structure ERC may be disposed under a contact region CT of the second substrate 20 or below a contact region CT of a stack ST. For instance the contact region CT of the stack ST may have a stepped shape, and the erase contact structure ERC may be disposed below the contact region CT patterned in a stepped shape.

The erase contact structure ERC may include one or more contact plugs 15. In this case, the contact plugs 15 may come into contact with a front surface of the first substrate 10 and a rear surface of the second substrate 20. The contact plugs 15 may be arranged in a first direction I-I' along an edge of the second substrate 20.

The discharge contact structure DCC may also include contact plugs 14. In this case, the contact plugs 15 of the erase contact structure ERC and the contact plugs 14 of the discharge contact structure DCC may be disposed on substantially the same level and have substantially the same shape.

The other general structure of this embodiment, other than the above-described structure, is substantially the same as that of the embodiment described with reference to FIGS. 1A and 1B; therefore, detailed explanation thereof will be omitted.

FIG. 2C is a modified embodiment of the discharge contact structure DCC and the erase contact structure ERC. The other structures of the semiconductor device shown in FIG. 2C are similar with those of FIG. 2B. Referring to FIG. 2C the discharge contact structure DCC may include the plurality of contact plugs 14 and at least one line 19. The first substrate 10 and the second substrate 20 may be coupled through the plurality of contact plugs 14 and at least one line 19. In addition, the lines 19 may be arranged in multiple layers.

The erase contact structure ERC may include the plurality of contact, plugs 15 and at least one line 16. An upper contact plug 15 and a lower contact plug 15 may be coupled through the line 16. In addition, the line 16 may be arranged in multiple layers, and the line 16 of the erase contact structure ERC may be located at the same level as the line 19 of the discharge contact structure DCC.

Figure 3A:
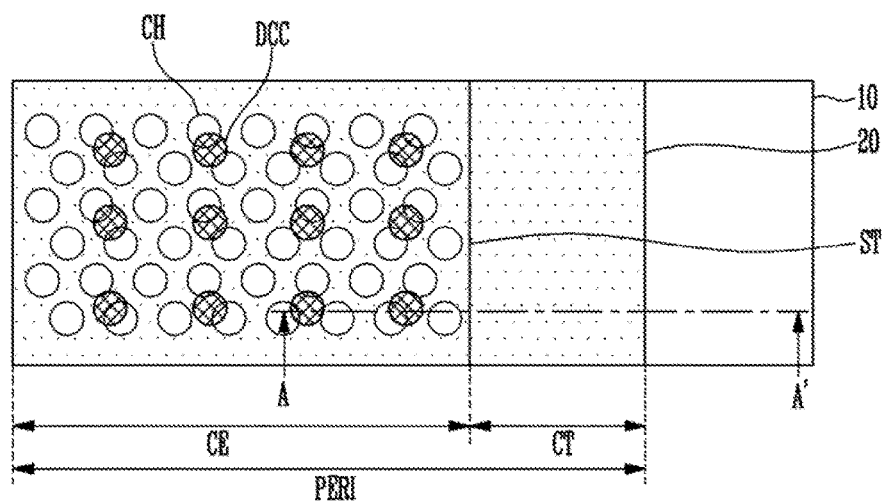
Figure 3B:
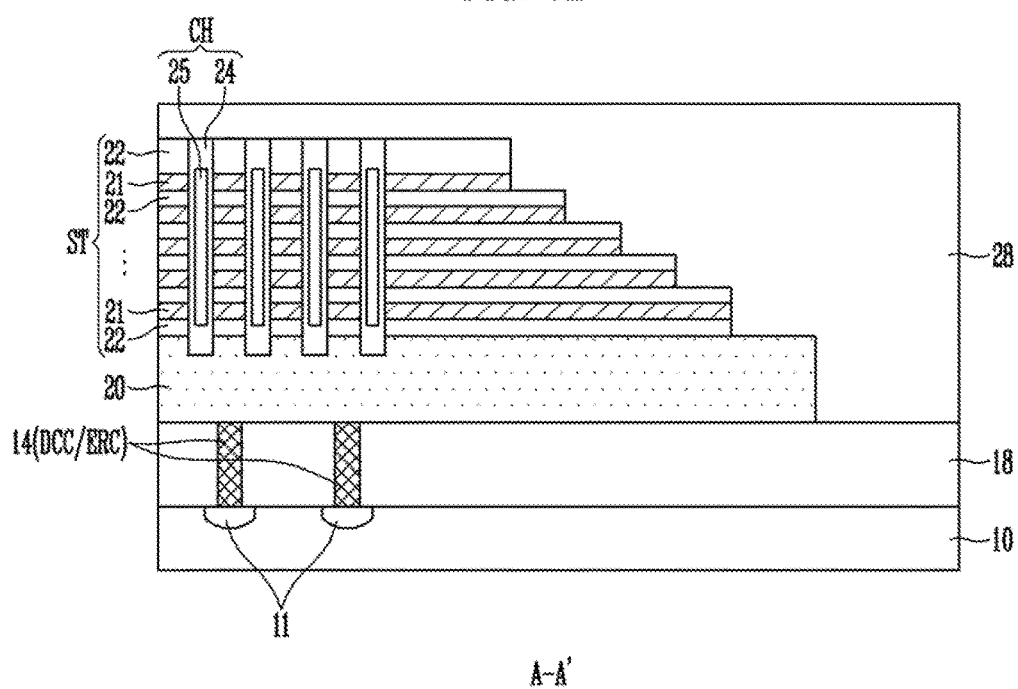

FIGS. 3A to 3C are views illustrating a structure of a semiconductor device according to an embodiment of the present disclosure. FIG. 3A is a layout diagram. FIGS. 3B and 3C are sectional views taken along line A-A' of FIG. 3A. Hereinbelow, repetitive explanation will be omitted if deemed redundant.

Referring to FIGS. 3A and 3B, the semiconductor device according to the embodiment of the present disclosure may include a discharge contact structure DCC, which electrically couples a first substrate 10 with a second substrate 20. The discharge contact structure DCC may also be used as an erase contact structure ERC.

For example, contact plugs 14 are disposed below a cell region CE of the stack ST, and electrically couple the first substrate 10 with the second substrate 20. Each of the contact plugs 14 may be used not only as a passage for discharging charges of the second substrate 20, but also as a passage for applying an erase bias during an erase operation. Therefore, the structure of the semiconductor device may be simplified.

FIG. 3C is a modified embodiment of the discharge contact structure DCC. The discharge contact structure DCC may be similar with the discharge contact structure DCC shown in 1C and the other structures of the semiconductor device may be similar with those of FIG. 3B. Referring to FIG. 3C, the discharge contact structure DCC may include the plurality of contact plugs 14 and at least one line 19. The first substrate 10 and the second substrate 20 may be coupled through the plurality of contact plugs 14 and at least one line 19. In addition, the discharge contact structure DCC may also be used as the erase contact structure ERC.

Figure 4A:
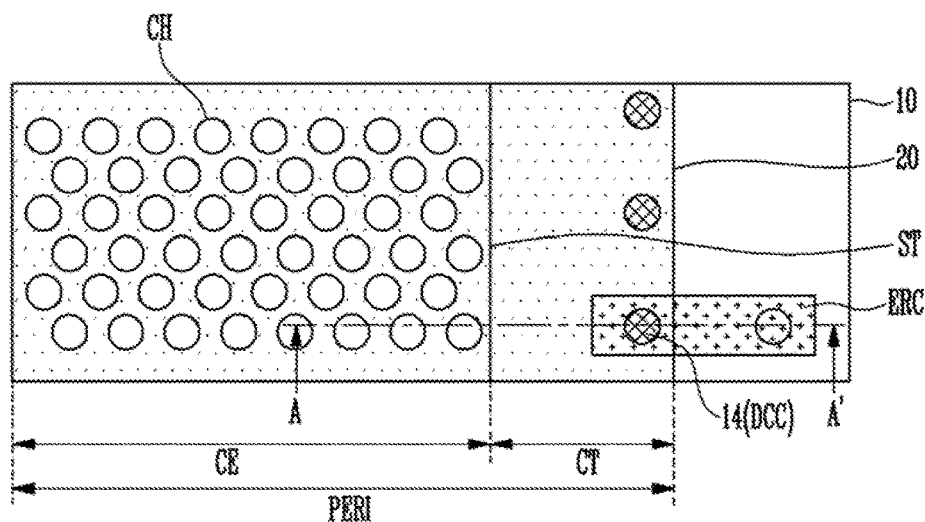
FIGS. 4A to 4C are diagrams illustrating a structure of a semiconductor device according to an embodiment of the present disclosure.
Figure 4B:
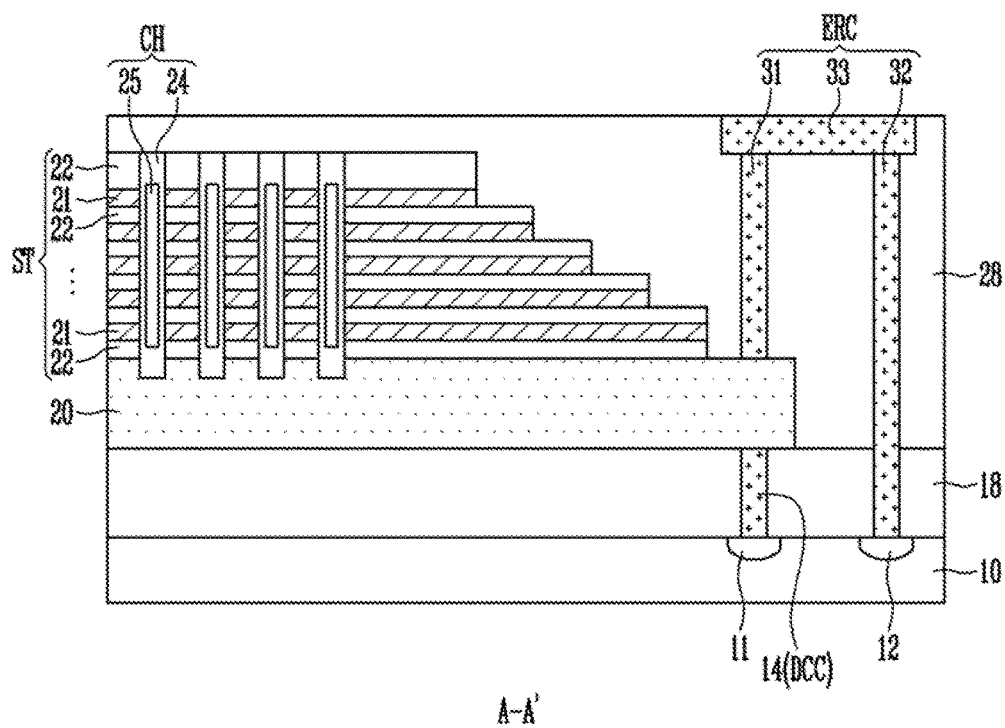
Figure 4C:
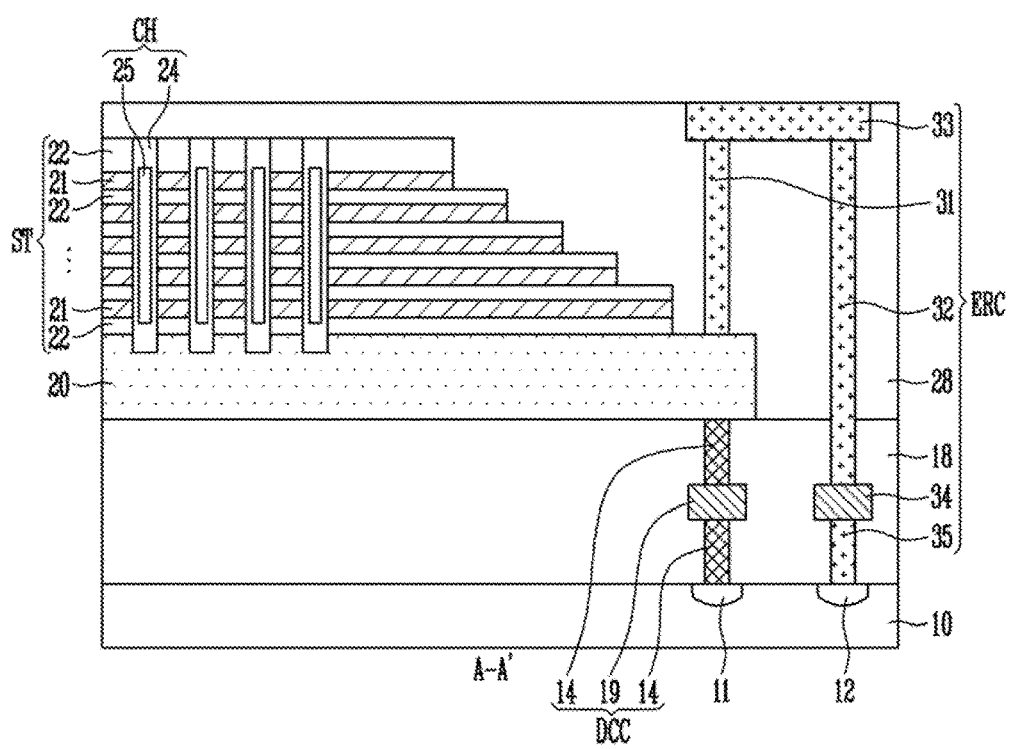

FIGS. 4A to 4C are views illustrating a structure of a semiconductor device according to an embodiment of the present disclosure. FIG. 4A is a layout diagram. FIGS. 4B and 4C are sectional views taken along line A-A' of FIG. 4A. Hereinbelow, repetitive explanation will be omitted if deemed redundant.

Referring to FIGS. 4A and 4B, the semiconductor device according to the embodiment of the present disclosure may include a discharge contact structure DCC and an erase contact structure ERC both of which electrically couple a first substrate 10 with a second substrate 20.

The erase contact structure ERC has a structure in which the first substrate 10 is electrically coupled with the second substrate 20. For instance, the erase contact structure ERC includes a first contact plug 31 electrically coupled with a front surface of the second substrate 20, a second contact plug 32 electrically coupled with a front surface of the first substrate, and a line 33 that electrically couples the first contact plug 31 with the second contact plug 32.

The discharge contact structure DCC may be disposed under a contact region CT of the second substrate 20, and be disposed below the erase contact structure ERC. For example, the discharge contact structure DCC may include at least one contact plug 14. The contact plug 14 may be disposed below the first contact plug 31. The contact plug 14 and the first contact plug 31 may overlap each other in a stack direction, and be arranged such that the centers thereof are aligned to each other.

FIG. 4C is a modified embodiment of the discharge contact structure DCC and the erase contact structure ERC. The other structures of the semiconductor device shown in FIG. 4C may be similar with those structure of FIG. 4B. Referring to FIG. 4C, the discharge contact structure DCC may include a plurality of contact plugs 14 and at least one line 19. In this case, the first substrate 10 and the second substrate 20 may be coupled through the plurality of contact plugs 14 and at least one line 19. In addition, the lines 19 may be arranged in multiple layers.

The erase contact structure ERC may include the plurality of contact plugs 31, 32 and 35, and the plurality of lines 33 and 34. The upper contact plug 32 and the lower contact plug 35 may be coupled through the line 34. In addition the line 34 may be arranged in multiple layers, and the line 34 of the erase contact structure ERC may be located at the same level as the line 19 of the discharge contact structure DCC.

Figure 5A:
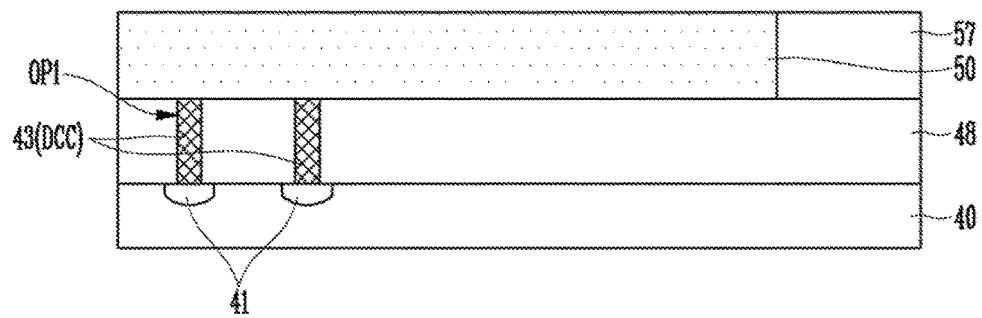
FIGS. 5A to 5C are sectional views illustrating a method of manufacturing a semiconductor device according to an embodiment of the present disclosure.
Figure 5B:
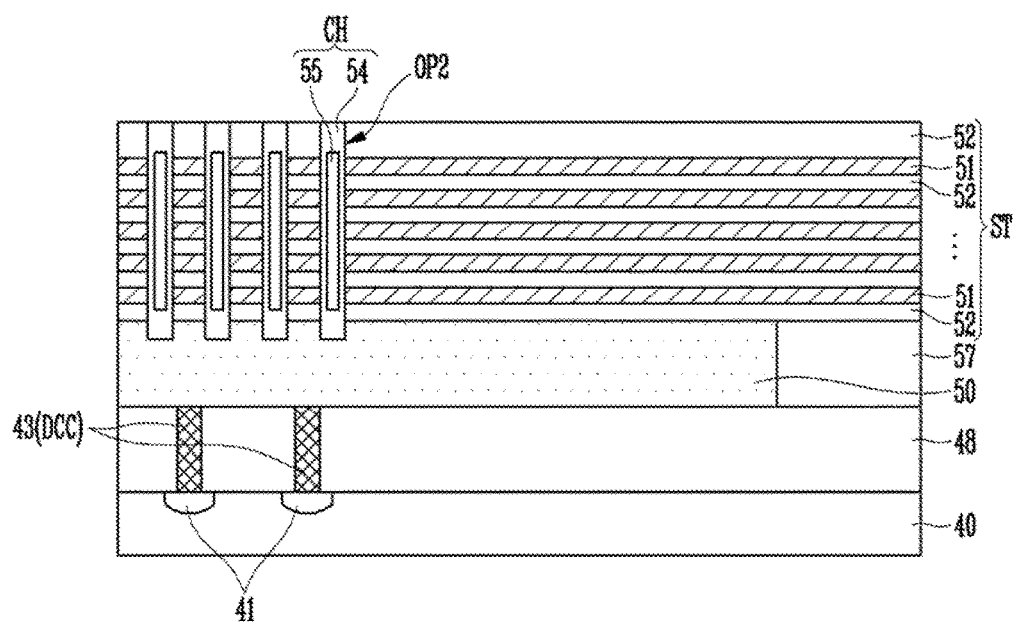
Figure 5C:
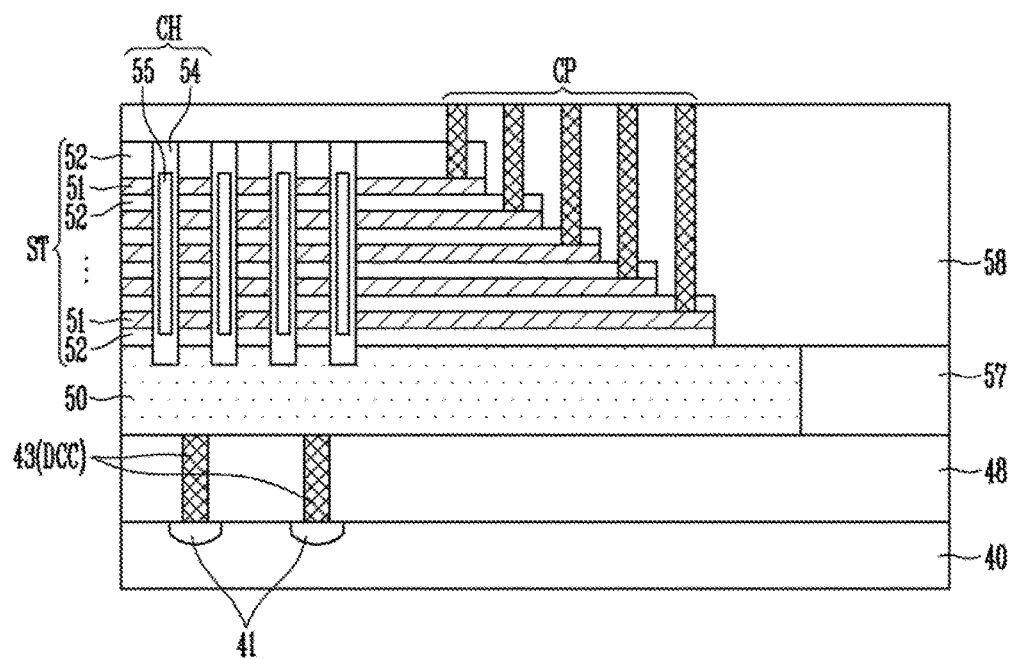

FIGS. 5A to 5C are sectional views illustrating a method of manufacturing a semiconductor device according to an embodiment of the present disclosure. Hereinbelow, repetitive explanation will be omitted if deemed redundant.

Referring to FIG. 5A, a first interlayer insulating layer 48, which includes a discharge contact structure DCC, is formed on a first substrate 40 in which a lower structure such as a peripheral circuit formed. For example, after the first interlayer insulating layer 48 is formed, and one or more first openings OP1 passing through the first interlayer insulating layer 48 are formed. The first openings OP1 are formed to a depth at which the first substrate 40 is exposed through the first openings OP1. Thereafter, first junctions 41 are formed n the first substrate 40 exposed through the respective first openings OP1. For example, each first junction 41 is formed by injecting an impurity into the first substrate 40 through the corresponding first opening OP1. Subsequently, contact plugs 43 are formed by filling the first openings OP1 with respective conductive layers. In this way, the discharge contact structure DCC, which includes one or more contact plugs 43 and is electrically coupled to the first substrate 40, is formed.

Thereafter, a second substrate 50 is formed on the first interlayer insulating layer 48. The second substrate 50 is provided to support a stack ST to be formed through a following process. The second substrate 50 may be a semiconductor substrate and have a width less than that of the first substrate 40. For instance, a polysilicon layer is formed on the first interlayer insulating layer 48, and the polysilicon layer is thereafter patterned. Subsequently, a second interlayer insulating layer 57 is formed in a region in which the polysilicon layer is etched. The polysilicon layer may include a well, region and contain a P-type impurity. In this way, the second substrate 50, which is electrically coupled with the first substrate 40 through the discharge contact structure DCC, is formed.

Referring to FIG. 5B, a stack ST is formed on the second substrate 50 and the second interlayer insulating layer 57. The stack ST may include first material layers 51 and second material layers 52 that are alternately stacked. The first material layers 51 may be provided to form gate electrodes of memory cells, select transistors, and the like. The second material layers 52 may be provided to insulate the stacked gate electrodes from each other The first material layers 51 are made of material having a high etch selectivity compared to the second material layers 52. For example, the first material layers 51 may be sacrificial layers including nitride or the like, and the second material layers 52 may be insulating layers including oxide or the like. Alternatively, the first material layers 51 may be conductive layers including polysilicon, tungsten, or the like, and the second material layers 52 may be insulating layers including oxide or the like. As a further alternative the first material layers 51 may be conductive layers including doped polysilicon or the like, and the second material layers 52 may be sacrificial layers including undoped polysilicon or the like.

Thereafter, channel structures CH passing through the stack ST is formed. For example, second openings OP2 are formed to pass through the stack ST and expose the second substrate 50. Subsequently, a channel layer 54 is formed in each of the second openings OP2, and a gap fill insulating layer 55 is formed in the channel layer 54. Before the channel layer 54 is formed a memory layer (not shown) may be formed in each of the second openings OP2.

Referring to FIG. 5C a sidewall of the stack ST is patterned in a stepped shape. The region that is patterned in a stepped shape may be a contact region of the stack ST. Subsequently, a third interlayer insulating layer 58 is formed on the stack ST patterned in a stepped shape, and the contact plugs CP that are coupled with the respective conductive layers 51 are thereafter formed, For reference, although not shown in the drawings a process of replacing the first material layers 51 or the second material layers 52 with third material layers may be performed. For example, in the case where the first material layers 51 are sacrificial layers and the second material layers 52 are insulating layers, conductive layers may substitute for the first material layers 51. Alternatively, in the case where the first material layers 51 are conductive layers and the second material layers 52 are insulating layers, the first material layers 51 may be silicidized. As a further alternative, in the case where the first material layers 51 are conductive layers and the second material layers 52 are sacrificial layers, insulating layers may substitute for the second material layers 52.

According to the above-mentioned process, after the second substrate 50 has been electrically coupled with the first substrate 40 through the discharge contact structure DCC, the stack ST, the second openings OP2, the channel structures CH, the third material layers, and so forth are formed. Therefore, charges in the second substrate 50 are discharged to the first substrate 40 through the discharge contact structure DCC, without being accumulated in the second substrate 50.

Depending on the position and the function of the discharge contact structure DCC, the above-described manufacturing method may partially change.

In the case of the semiconductor device described above with reference to FIGS. 1A and 1B, the third interlayer insulating layer 58 is formed before an erase contact structure ERC is formed. For example, a first contact hole that passes through the third interlayer insulating layer 58 and exposes the second substrate 50, and a second contact hole that passes through the first to third interlayer insulating layers 48, 57, and 58 and exposes the first substrate 40, are formed. Thereafter, a second junction is formed in the first substrate 40 exposed through the second contact hole. The second junction may also be formed in the second substrate 50 exposed through the first contact hole. Subsequently, the first and second contact holes are filled with the conductive layer to form first and second contact plugs. Thereafter, a line is formed to couple the first contact plug with the second contact plug. In this way, the erase contact structure ERC of FIG. 1B may be formed.

In the case of the semiconductor device described above with reference to FIGS. 2A and 2B, the first interlayer insulating layer 48, which includes the discharge contact structure DCC and the erase contact structure ERC, is formed. For instance, the first interlayer insulating layer 48 is formed before a first opening OP1 for forming the discharge contact structure DCC and a first opening OP1 for forming the erase contact structure ERC are formed. Subsequently, the first opening OP1 for forming the discharge contact structure DCC and the first opening OP1 for forming the erase contact structure ERC are filled with conductive layers to form the discharge contact structure DCC that includes the contact plug 43 and the erase contact structure ERC that includes a contact plug. In this case, the discharge contact structure DCC and the erase contact structure ERC may be formed through the same process, be disposed on substantially the same level and have substantially the same shape.

In the case of the semiconductor device described above with reference to FIGS. 3A and 3B, to apply an erase bias to the well region of the second substrate 50 through the discharge contact structure DCC, a related circuit is formed around the discharge contact structure DCC. For example, before the first interlayer insulating layer 48 is formed, an erase voltage generator including a charge pump or the like is formed on the first substrate 40.

In the case of the semiconductor device described above with reference to FIGS. 4A and 4B, the discharge contact structure DCC is formed under the contact region of the second substrate 50 The erase contact structure ERC is formed after the third interlayer insulating layer 58 is formed.

In addition, the manufacturing method may change depending on the structure, the arrangement, etc. of the discharge contact structure DCC. The above-described embodiments may change or be combined.

Figure 6:
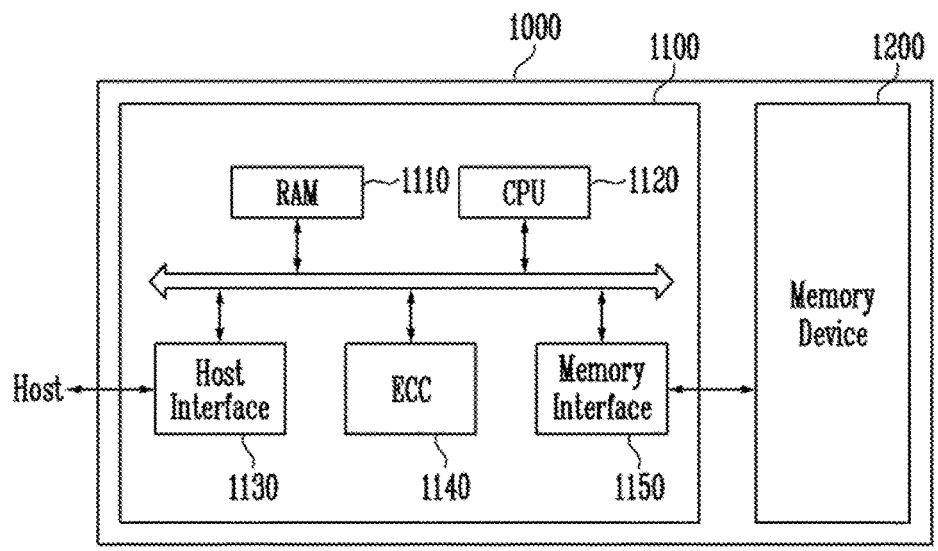
FIGS. 6 and 7 are block diagrams illustrating a configuration of a memory system according to an embodiment of the present disclosure.

FIG. 6 is a block diagram illustrating a configuration of a memory system according to an embodiment of the present disclosure.

Referring FIG. 6, a memory system 1000 according to an embodiment of the present disclosure includes a memory device 1200 and a controller 1100.

The memory device 1200 is used to store data information having a variety of data forms such as text, graphics, and software codes. The memory device 1200 may be a non-volatile memory. Furthermore, the memory device 1200 may have the structure described above with reference to FIGS. 1A to 5C, and may be manufactured by the manufacturing method described above with reference to FIGS. 1A to 5C. In the embodiment, the memory device 1200 may include a first substrate, a second substrate disposed on the first substrate, a stack which is disposed on the second substrate and includes stacked memory cells, and a discharge contact structure electrically coupling the second substrate with the first substrate such that charges in the second substrate are discharged to the first substrate. The structure of the memory device 1200 and the manufacturing method thereof are the same as those described above. Therefore, detailed explanation thereof will be omitted.

The controller 1100 may be coupled to a host Host and the memory device 1200. The controller 1100 may access the memory device 1200 in response to a request from the host Host. For example, the controller 1100 may control read, write, erase, and background operations of the memory device 1200.

The controller 1100 includes a random access memory (RAM) 1110, a central processing unit (CPU) 1120, a host interface 1130, an error correction code (ECC) circuit 1140, and, a memory interface 1150.

The RAM 1110 is used as an operation memory of the CPU 1120, a cache memory between the memory device 1200 and the host Host, a buffer memory between the memory device 1200 and the host Host, and so forth. For reference, the RAM 1110 may be replaced with a static random access memory (SRAM), a read only memory (ROM), or the like.

The CPU 1120 may control the overall operation of the controller 1100. For example, the CPU 1120 may operate firmware such as a flash translation layer (FTL) stored in the RAM 1110.

The host interface 1130 may interface with the host Host. For example, the controller 1100 may communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol a serial-ATA protocol, a parallel-ATA protocol, a small computer small interface (SCSI) protocol, an enhanced small disk interface (ESDI) protocol, and an integrated drive electronics (IDE) protocol, a private protocol, and the like.

The ECC circuit 1140 may use an error correction code (ECC) to detect and correct errors in data read from the memory device 1200.

The memory interface 1150 may interface with the memory device 1200. For example, the memory interface 1150 may include a NAND interface or a NOR interface.

For reference, the controller 1100 may further include a buffer memory (not shown) for temporarily storing data. The buffer memory may be used to temporarily store data to be transferred from the host interface 1130 to an external device or data to be transferred from the memory interface 1150 to the memory device 1200. In addition, the controller 1100 may further include a ROM that stores code data for interfacing with the host Host.

Figure 7:
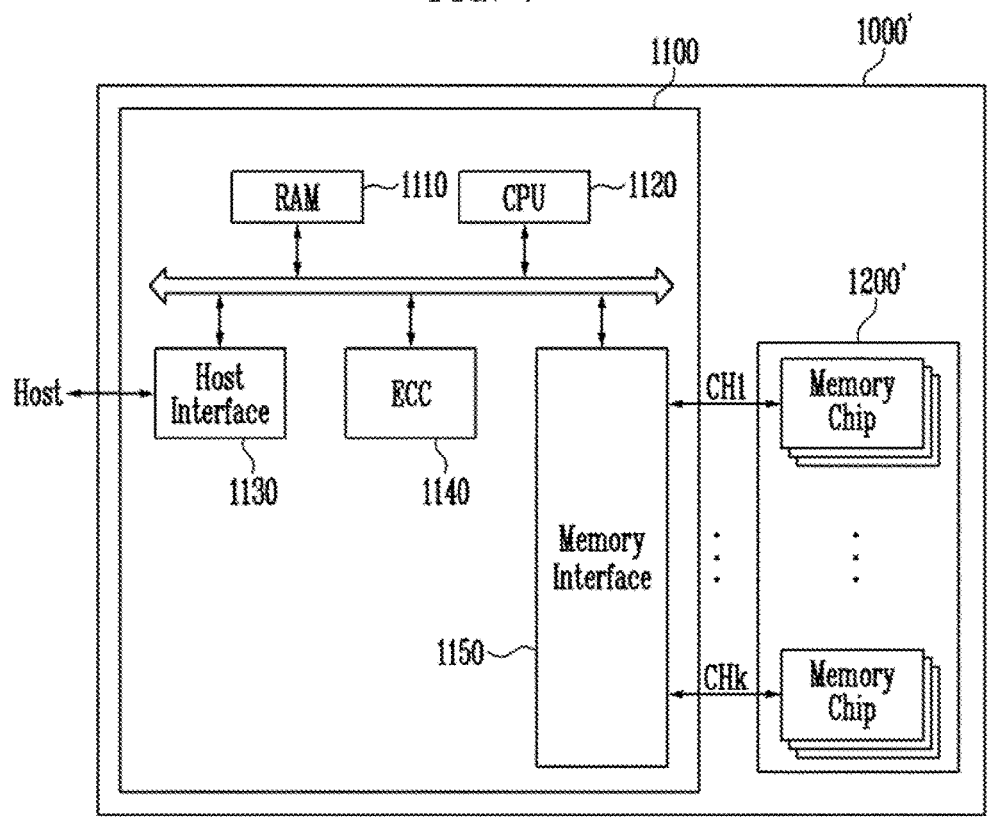

Since the memory system 1000 according to the present embodiment includes the memory device 1200 having improved integration and characteristics, the integration and characteristics of the memory system 1000 may also be improved, FIG. 7 is a block diagram illustrating a configuration of a memory system according to an embodiment of the present disclosure. Hereinbelow, repetitive explanation will be omitted if deemed redundant.

Referring to FIG. 7, a memory system 1000' according to the embodiment may include a memory device 1200' and a controller 1100. The controller 1100 includes a RAM 1110, a CPU 1120, a host interface 1130, an ECC circuit 1140, a memory interface 1150 and so on.

The memory device 1200' may be a nonvolatile memory. Furthermore, the memory device 1200' may have the structure described above with reference to FIGS. 1A to 5C, and may be manufactured by the manufacturing method described above with reference to FIGS. 1A to 5C. In the embodiment, the memory device 1200' may include a first substrate, a second substrate disposed on the first substrate, a stack which is disposed on the second substrate and includes stacked memory cells, and a discharge contact structure electrically coupling the second substrate with the first substrate such that charges in the second substrate are discharged to the first substrate. The structure of the memory device 1200' and the manufacturing method thereof are the same as those described above. Therefore, detailed explanation thereof will be omitted.

Furthermore, the memory device 1200' may be a multi-chip package including a plurality of memory chips. The plurality of memory chips are divided into a plurality of groups. The plurality of groups may communicate with the controller 1100 through first to k-th channels CH1 to CHk. The memory chips of each group communicate with the controller 1100 through a common channel. For reference, the memory system 1000' may be modified such that each single memory chip is coupled to a corresponding single channel.

As described above, since the memory system 1000' according to the embodiment includes the memory device 1200' having improved integration and characteristics, the integration and characteristics of the memory system 1000' may also be improved. In particular, the memory device 1200' according to the present embodiment is formed of a multi-chip package, whereby the data storage capacity and the operating speed thereof can be enhanced.

Figure 8:
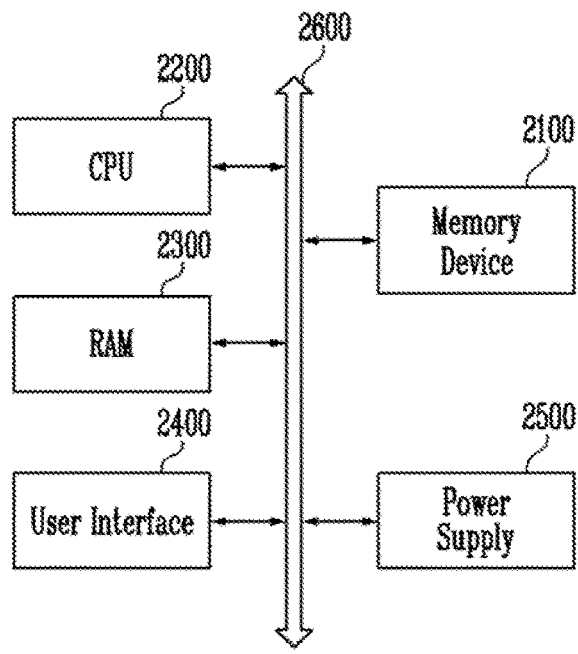
FIGS. 8 and 9 are block diagrams illustrating a configuration of a computing system according to an embodiment of the present disclosure.

FIG. 8 is a block diagram illustrating a configuration of a computing system according to an embodiment of the present disclosure. Hereinbelow, repetitive explanation will be omitted if deemed redundant.

Referring to FIG. 8, the computing system 2000 according to the embodiment of the present disclosure includes a memory device 2100, a CPU 2200, a RAM 2300, a user interface 2400, a power supply 2500, a system bus 2600, and so forth.

The memory device 2100 stores data provided via the user interface 2400, data processed by the CPU 2200, etc. Furthermore the memory device 2100 is electrically coupled to the CPU 2200, the RAM 2300, the user interface 2400, the power supply 2500, etc. by the system bus 2600. For example, the memory device 2100 may be coupled to the system bus 2600 via a controller (not shown) or, alternatively, directly coupled to the system bus 2600. In the case where the memory device 2100 is directly coupled to the system bus 2600, the function of the controller may be performed by the CPU 2200, the RAM 2300, etc., The memory device 2100 may be a nonvolatile memory. Furthermore, the memory device 2100 may have the structure described above with reference to FIGS. 1A to 5C, and may be manufactured by the manufacturing method described above with reference to FIGS. 1A to 5C. In the embodiment, the memory device 2100 may include a first substrate, a second substrate disposed over the first substrate, a stack which is disposed on the second substrate and includes stacked memory cells, and a discharge contact structure electrically coupling the second substrate with the first substrate such that charges in the second substrate are discharged to the first substrate. The structure of the memory device 2100 and the manufacturing method thereof are the same as those described above. Therefore, detailed explanation thereof will be omitted.

As described above with reference to FIG. 7, the memory device 2100 may be a multi-chip package configured with a plurality of memory chips.

The computing system 2000 having the above-mentioned configuration may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, or the like.

As described above, since the computing system 2000 according to the embodiment includes the memory device 2100 having improved integration and characteristics, the characteristics of the computing system 2000 may also be improved.

Figure 9:
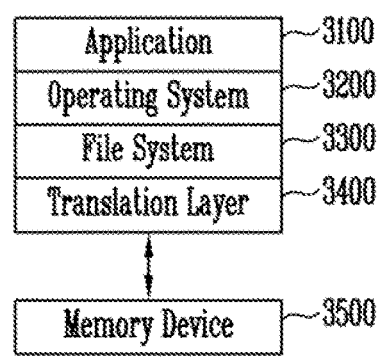

FIG. 9 is a block diagram illustrating a computing system according to an embodiment of the present disclosure.

Referring to FIG. 9 the computing system 3000 according to the embodiment of the present disclosure may include a software layer, which has an operating system 3200, an application 3100, a file system 3300, a translation layer 3400, and so forth. Furthermore, the computing system 3000 includes a hardware layer such as a memory device 3500.

The operating system 3200 manages software resources and hardware resources, etc. of the computing system 3000 and may control program execution by the CPU. The application 3100 may be various application programs executed in the computing system 3000 and may be a utility executed by the operating system 3200.

The file system 3300 refers to a logical structure for controlling data, files, etc. which are present in the computing system 3000 and organizes files or data to be stored in the memory device 3500 or the like according to a given rule. The file system 3300 may be determined depending on the operating system 3200 used in the computing system 3000. For example, if the operating system 3200 is Microsoft's Windows system, the file system 3300 may be a file allocation table (FAT), an NT file system (NTFS), or the like. If the operating system 3200 is a Unix/Linux system, the file system 3300 may be an extended file system (EXT), a Unix file system (UFS), a journaling file system (JFS), or the like.

Although the operating system 3200, the application 3100 and the file system 3300 are expressed by separate blocks in the drawing, the application 3100 and the file system 3300 may be included in the operating system 3200.

The translation layer 3400 translates an address into a suitable form for the memory device 3500 in response to a request from the file system 3300. For example, the translation layer 3400 translates a logical address produced by the file system 3300 into a physical address of the memory device 3500. Mapping information of the logical address and the physical address may be stored in an address translation table. For example, the translation layer 3400 may be a flash translation layer (FTL), a universal flash storage link layer (ULL), or the like.

The memory device 3500 may be a nonvolatile memory. Furthermore, the memory device 3500 may have the structure described above with reference to FIGS. 1A to 5C, and may be manufactured by the manufacturing method described above with reference to FIGS. 1A to 5C. In the embodiment, the memory device 3500 may include a first substrate, a second substrate disposed on the first substrate, a stack which is disposed on the second substrate and includes stacked memory cells, and a discharge contact structure electrically coupling the second substrate with the first substrate such that charges in the second substrate are discharged to the first substrate. The structure of the memory device 3500 and the manufacturing method thereof are the same as those described above. Therefore, detailed explanation thereof will be omitted.

The computing system 3000 having the above-mentioned configuration may be divided into an operating system layer implemented in an upper level region and a controller layer implemented in a lower level region. The application 3100, the operating system 3200, and the file system 3300 may be included in the operating system layer, and may be driven by an operating memory of the computing system 3000. The translation layer 3400 may be included in the operating system layer or the controller layer.

As described above, since the computing system 3000 according to the present embodiment includes the memory device 3500 having improved integration and characteristics, the characteristics of the computing system 3000 may also be improved.

The present disclosure may provide a semiconductor device having a stable structure and improved reliability. In manufacturing the semiconductor device, the manufacturing process may be facilitated, a procedure thereof may be simplified and he manufacturing cost may be reduced.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor device comprising:
a first substrate;
a second substrate disposed over the first substrate;
a stack with stacked memory cells disposed on the second substrate; and
a discharge contact structure electrically coupling the second substrate with the first substrate, wherein charges in the second substrate are discharged to the first substrate,
wherein the second substrate comprises a well region, and an erase bias is applied to the well region of the second substrate through the discharge contact structure.

2. The semiconductor device according to claim 1, wherein the discharge contact structure comprises one or more contact plugs that contact with a front surface of the first substrate and a rear surface of the second substrate.

3. The semiconductor device according to claim 2, wherein the stack comprises channel structures passing through the stack, and the contact plugs are disposed between the channel structures.

4. The semiconductor device according to claim 1, wherein the first substrate comprises a junction that contacts with the discharge contact structure.

5. The semiconductor device according to claim 1, further comprising:
a peripheral circuit formed on the first substrate.

6. The semiconductor device according to claim 1, wherein each of the first substrate and the second substrate is a semiconductor substrate.

7. The semiconductor device according to claim 1, wherein the discharge contact structure is disposed below the memory cells.

8. The semiconductor device according to claim 1, further comprising:
an erase contact structure electrically coupling the second substrate with the first substrate, wherein the erase bias is applied to the well region of the second substrate.

9. A semiconductor device comprising:
a first substrate;
a second substrate disposed over the first substrate; and
a discharge contact structure electrically coupling the second substrate with the first substrate, wherein charges in the second substrate are discharged to the first substrate,
wherein the discharge contact structure is a passage for discharging the charges of the second substrate and a passage for applying an erase bias.

10. The semiconductor device according to claim 1, wherein the stack includes conductive layers and insulating layers that are alternately stacked.

11. The semiconductor device according to claim 8, wherein the erase contact structure comprises:
a first contact plug electrically coupled with a front surface of the second substrate;
a second contact plug electrically coupled with the front surface of the first substrate; and
a line electrically coupling the first contact plug with the second contact plug.

12. The semiconductor device according to claim 8, wherein the stack comprises a cell region including the memory cells, and a contact region patterned in a stepped shape, and
wherein the discharge contact structure is disposed below the cell region, and the erase contact structure is disposed below the contact region.

13. The semiconductor device according to claim 12,
wherein the erase contact structure includes one or more contact plugs so that the contact plugs contact with a front surface of the first substrate and a rear surface of the second substrate.

14. The semiconductor device according to claim 1,
wherein the stack comprises a cell region including the memory cells, and a contact region patterned in a stepped shape, and
wherein the discharge contact structure is disposed below the contact region.

15. The semiconductor device according to claim 14, further comprising:
an erase contact structure electrically coupling the second substrate with the first substrate, wherein an erase bias is applied to a well region of the second substrate.

16. The semiconductor device according to claim 15, wherein the erase contact structure comprises:
a first contact plug electrically coupled with a front surface of the second substrate and disposed over the discharge contact structure;
a second contact plug electrically coupled with a front surface of the first substrate; and
a line electrically coupling the first contact plug with the second contact plug.

17. The semiconductor device according to claim 1, wherein the discharge contact structure comprises:
a first contact plug electrically coupled with a front surface of the first substrate;
a second contact plug electrically coupled with a rear surface of the second substrate; and
a line electrically coupling the first contact plug with the second contact plug.

18. The semiconductor device according to claim 9, wherein the discharge contact structure comprises one or more contact plugs that contact with a front surface of the first substrate and a rear surface of the second substrate.

19. The semiconductor device according to claim 9, further comprising:
stacked memory cells over the second substrate, wherein the discharge contact structure is disposed below the memory cells.

* * * * *